United States Patent
Liu et al.

(10) Patent No.: US 8,338,935 B2
(45) Date of Patent: Dec. 25, 2012

(54) THERMALLY ENHANCED ELECTRONIC PACKAGE UTILIZING CARBON NANOCAPSULES AND METHOD OF MANUFACTURING THE SAME

(75) Inventors: An Hong Liu, Hsinchu (TW); David Wei Wang, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 0 days.

(21) Appl. No.: 13/116,278

(22) Filed: May 26, 2011

(65) Prior Publication Data

US 2011/0304045 A1 Dec. 15, 2011

Related U.S. Application Data

(60) Provisional application No. 61/354,927, filed on Jun. 15, 2010.

(51) Int. Cl.
*H01L 23/22* (2006.01)
*H01L 21/00* (2006.01)
*H05K 7/00* (2006.01)

(52) U.S. Cl. . 257/687; 257/783; 257/789; 257/E23.116; 361/746; 438/112; 438/118; 438/126; 438/127

(58) Field of Classification Search .......................... None
See application file for complete search history.

(56) References Cited

U.S. PATENT DOCUMENTS

| | | | |
|---|---|---|---|
| 6,841,509 B1 | 1/2005 | Hwang et al. | |
| 6,872,236 B1 | 3/2005 | Hwang | |
| 6,951,811 B2 * | 10/2005 | Sorimachi | 438/637 |
| 6,982,492 B2 * | 1/2006 | Rumer et al. | 257/783 |
| 7,156,958 B2 | 1/2007 | Hwang | |
| 7,396,520 B2 | 7/2008 | Howard et al. | |
| 7,619,318 B2 * | 11/2009 | Rumer et al. | 257/789 |
| 7,687,890 B2 * | 3/2010 | Subramanian et al. | 257/629 |
| 7,800,138 B2 * | 9/2010 | Baek et al. | 257/211 |
| 2003/0117770 A1 | 6/2003 | Montgomery et al. | |
| 2004/0084784 A1 * | 5/2004 | Mueller et al. | 257/788 |
| 2004/0126303 A1 | 7/2004 | Hwang | |
| 2006/0008404 A1 | 1/2006 | Hwang | |
| 2008/0287591 A1 | 11/2008 | Hwang | |
| 2009/0001599 A1 * | 1/2009 | Foong et al. | 257/777 |
| 2009/0053859 A1 * | 2/2009 | Xu et al. | 438/118 |
| 2010/0155934 A1 * | 6/2010 | Yim et al. | 257/704 |

* cited by examiner

*Primary Examiner* — Alonzo Chambliss
(74) *Attorney, Agent, or Firm* — WPAT, P.C.; Anthony King (57) ABSTRACT

A thermally enhanced electronic package comprises a chip, a substrate, an adhesive, and an encapsulation. The adhesive or the encapsulation is mixed with carbon nanocapsules. The substrate includes an insulation layer and a wiring layer formed on the substrate. The adhesive covers the chip and the substrate. The chip is electrically connected to the wiring layer. The encapsulation covers the chip and the substrate.

19 Claims, 10 Drawing Sheets

THERMALLY ENHANCED ELECTRONIC PACKAGE UTILIZING CARBON NANOCAPSULES AND METHOD OF MANUFACTURING THE SAME

CROSS REFERENCE TO RELATED APPLICATIONS

This non-provisional application claims priority under 35 U.S.C. §119(e) of U.S. Provisional Application No. 61/354,927, filed Jun. 15, 2010, the entire contents of which are hereby incorporated by reference.

BACKGROUND OF THE INVENTION

1. Field of the Invention

The present invention relates to a thermally enhanced electronic package, and more particularly, to an electronic package with high thermal dissipation capability.

2. Description of the Related Art

Continuous demand for improved performance of semiconductor products results in higher operating frequencies and greater power consumption. Therefore, electrical packages having high thermal conductivity capable of effective heat dissipation to reduce interconnect junction temperatures are needed for semiconductor products. One such electrical package is a type of semiconductor device called a liquid crystal display (LCD) driver. In addition, heat management solutions are also needed for high power packages using substrates as chip carriers.

Figure 1:
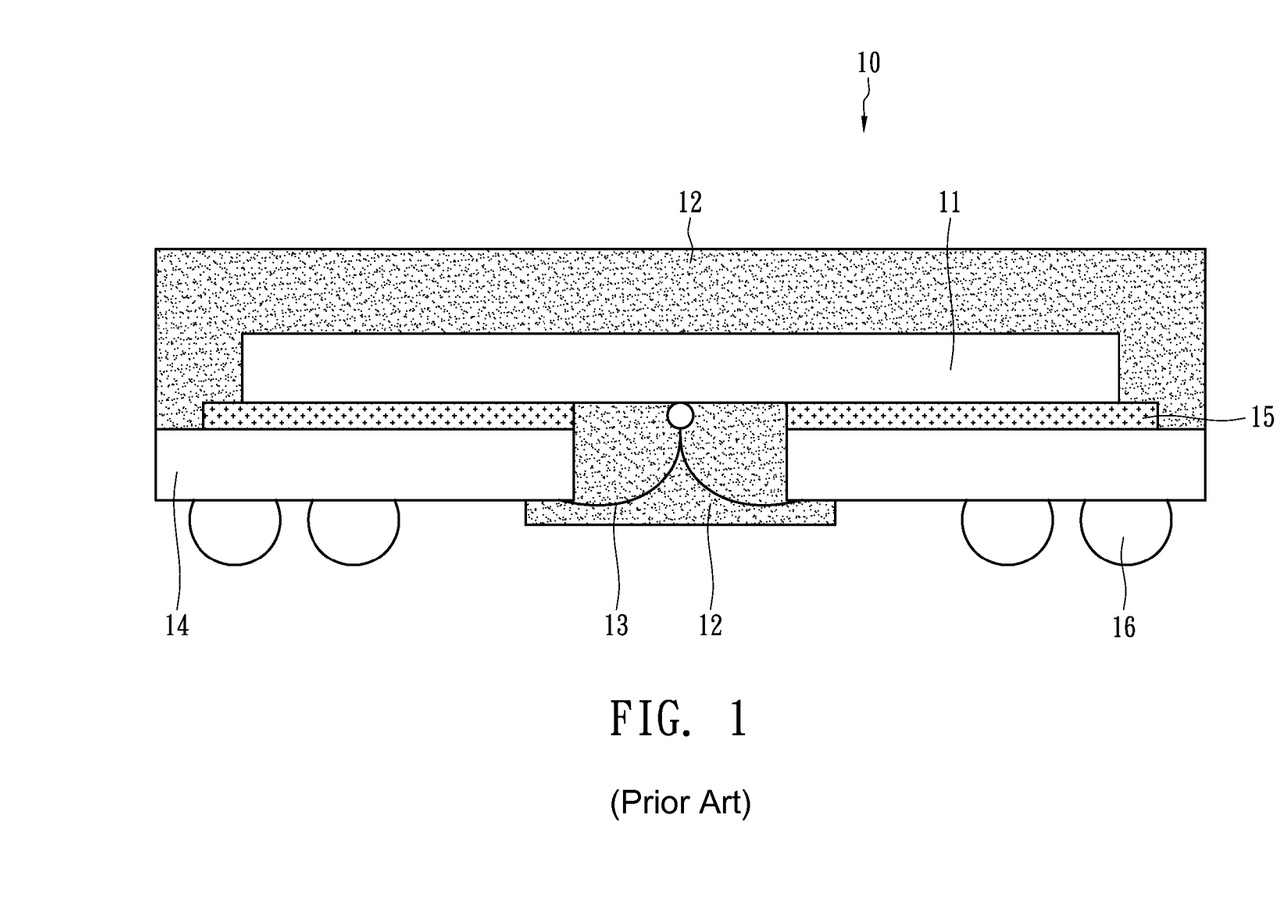
FIG. 1 is a cross-sectional diagram of a conventional FBGA package.

A typical high power package known as a fine pitch ball grid array (FBGA) is illustrated in FIG. 1. The FBGA package 10 comprises a chip 11 and a substrate 14. The substrate 14 can be a rigid or flexible printed circuit board. The chip 11 is mounted on the substrate 14 by a die attaching material 15 such as an adhesive film. Metal wires 13 are connected to the substrate 14 from the active surface of the chip 11. Encapsulants 12 cover the chip 11, the substrate 14 and the metal wires 13 to protect the chip 11 and the metal wires 13 from damage. Solder balls 16 are disposed on the substrate 14, and act as the I/O terminals of the FBGA package 10. With the circuits densely arranged on a limited area of the chip 11, more heat is generated, and the FBGA package 10 suffers from insufficient thermal dissipation. The encapsulants 12 include epoxy resin, which has poor thermal conductivity, causing the heat to accumulate in the FBGA package 10. In general, the insulating layers of the substrate 14 are polymers which also have poor thermal conductivity, so the accumulated heat is not easily dissipated from the insulating layers to the outside of the FBGA package 10.

A new generation of three-dimensional integrated circuits and components is emerging. The arrangement involving stacking of two-dimensional chips by sandwiching two or more ICs using a fabrication process required a solution to create vertical connections between the layers. IBM solved this problem by developing "through silicon vias" (TSVs) which are vertical connections etched through the silicon wafer and filled with metal. The approach of using TSVs to create 3D connections allows the addition of a greater number of pathways between 2D layers.

Figure 2:
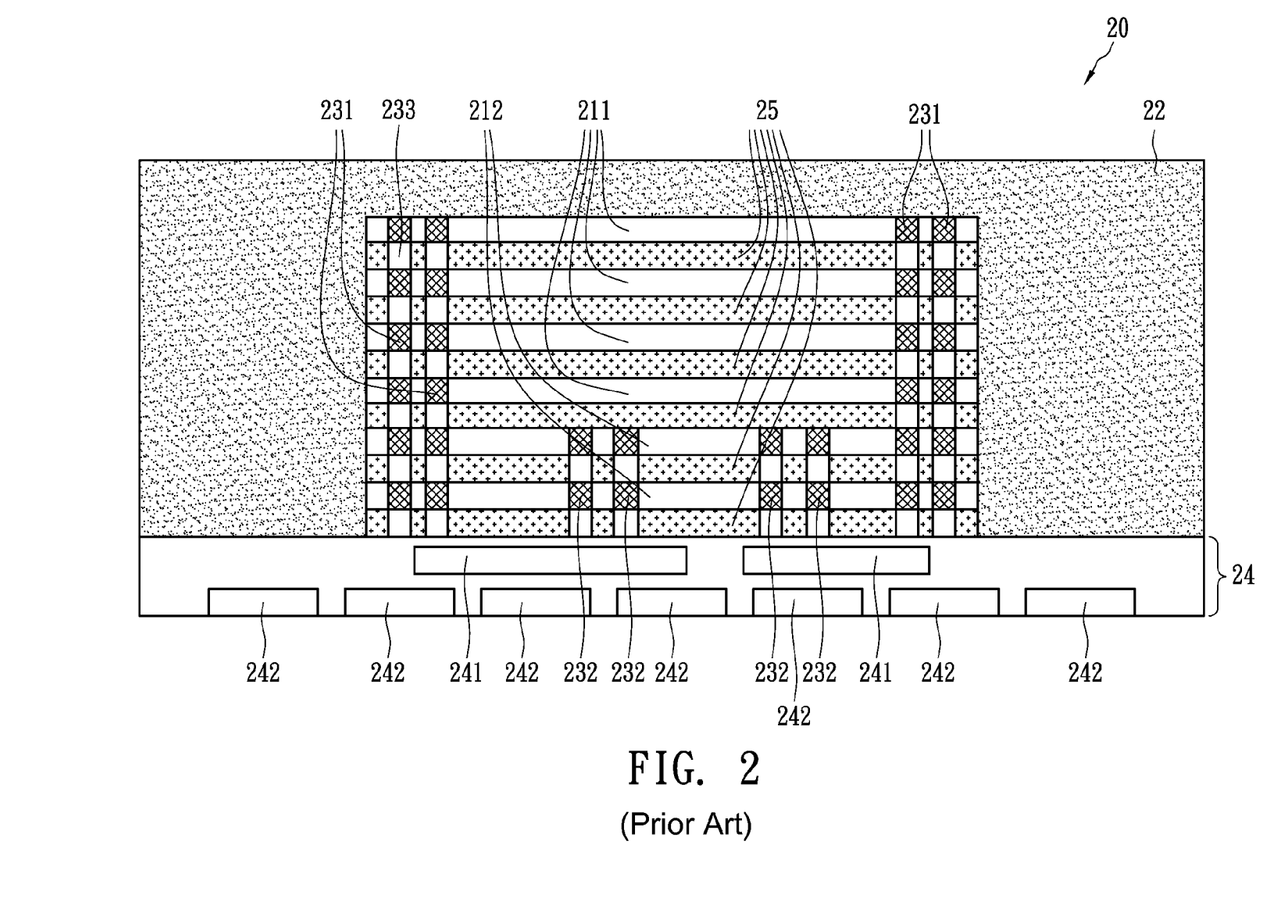
FIG. 2 is a cross-sectional diagram of a conventional 3D IC package using TSVs.

FIG. 2 shows a three-dimensional IC package using TSVs. The 3D IC package 20 comprises a plurality of IC chips (211, 212), TSVs (231, 232), and a substrate 24. The TSVs 231, 232 are formed through the IC chips (211, 212) with a plurality of micro bumps (or soft metal caps) 233 formed respectively on the surfaces of TSVs 231, 232. The plurality of micro bumps 233 are used for electrically connecting IC chips (211, 212) and connecting the substrate 24 to adjacent TSVs 231, 232. Adhesives 25 attach the chips (211, 212) together and mount them onto the substrate 24. An encapsulant 22 covers the chips (211, 212) and the substrate 24. Several passive IC chips 241 are embedded into the substrate 24, and terminals or electrodes 242 are disposed on the lower surface of the substrate 24.

In the conventional 3D IC package 20, many chips (211, 212) are put into a package body. Each chip generates heat, which is accumulated in the package body. The accumulated heat cannot be effectively dissipated to the outside through the encapsulant 22 or the substrate 24. Therefore, to remedy the conventional drawbacks, novel materials and methods are needed to improve the thermal performance of the package.

SUMMARY OF THE INVENTION

One aspect of the present invention provides a thermally enhanced electronic package. A dielectric resin material mixed with carbon nanocapsules (CNC) is used in the electronic packaging to improve thermal dissipation. As the CNC transfers and dissipates heat into infrared energy through absorption and radiation, the CNC mixed material is effective for thermal dissipation and is thus capable of reducing the operating temperature of the electronic package.

In view of the above, the present invention discloses a thermally enhanced electronic package which comprises a chip, a substrate, an adhesive, and an encapsulation. The adhesive or the encapsulation is mixed with carbon nanocapsules. The substrate includes an insulation layer and a wiring layer formed on the insulation layer. The adhesive is disposed between the chip and the substrate. The chip is electrically connected to the wiring layer. The encapsulation covers the chip and the substrate.

The present invention further discloses a thermally enhanced electronic package which comprises a plurality of chips, a substrate, a first adhesive, a plurality of second adhesives, and an encapsulation. The first adhesive, the second adhesives or the encapsulation are mixed with carbon nanocapsules. The substrate includes an insulation layer and a wiring layer formed on the insulation layer. One of the chips is attached to the substrate by the first adhesive, and the other chips are vertically stacked together by the second adhesives. The chips are electrically connected to the wiring layer. The encapsulation covers the chip and the substrate.

The present invention further discloses a thermally enhanced wafer level chip scale package including a chip, a plurality of bond pads, a plurality of redistributed bond pads, a rewiring metal layer configured for redistributing the plurality of bond pads to the plurality of redistributed bond pads, a resin material covering the chip; and a plurality of carbon nanocapsules mixed in the resin material.

BRIEF DESCRIPTION OF THE DRAWINGS

The invention will be described according to the appended drawings in which.

PREFERRED EMBODIMENT OF THE PRESENT INVENTION

The invention relates to the application of carbon nanocapsules to semiconductor packages so that the semiconductor packages can have enhanced thermal dissipation characteristics. In particular, a dielectric material or resin is blended with a plurality of carbon nanocapsules for use in electronic packaging applications with the purpose of improving heat dissipation of semiconductor chips. Such a mixed material or resin is directly or indirectly in contact with semiconductor chips to improve heat transfer and dissipation. The mixed material can be applied in the portion of a semiconductor package such as flip chip underfill, non-flow underfill, chip encapsulant, chip coating, die-attach adhesives, non-conductive paste/film, conductive paste/film, film-on-wire, etc.

Carbon nanocapsules in the mixed material have the characteristic of effectively transforming heat into infrared radiation through absorption and radiation, which is the optimum method of heat removal from electrical packages. In some embodiments, the carbon nanocapsule surfaces can be further processed to ensure they are electrically insulated to prevent parasitic effects or electrical shorts in applications; in addition, the carbon nanocapsule surfaces may be optionally functionalized to achieve good interfacial adhesion between the nanocapsule particles and the base resin so that nanocapsules can be evenly dispersed in the base resins.

The carbon nanocapsules in the mixed material can have sizes between approximately 1 and 100 nm, and have an average diameter of around 30 nm. There are two types of carbon nanocapsules: hollow and metal-filled. The carbon nanocapsules in the mixed material can include hollow carbon nanocapsules, metal-filled nanocapsules, or both. The metal-filled nanocapsules may be filled with metals, metal oxides, metal carbides, or alloys.

In some embodiments, the carbon nanocapsules in the mixed material can be treated to have electric insulating layers. In some embodiments, the carbon nanocapsule surfaces may be functionalized to achieve good interfacial adhesion between carbon nanocapsule particles and the resins.

Therefore, the aforesaid mixture is suitable for use in direct contact with a functional silicon die in a semiconductor package. Compared to the usage of conventional heat conduction and convection for semiconductor package heat dissipation, additional paths of transferring heat using infrared radiation through the body of silicon chips enable much more efficient removal of thermal energy. Applications for such materials include encapsulant, flip-chip underfill, and coatings. The above mixture is also suitable for various die attach adhesive applications for use in attaching a die onto a substrate (rigid or flexible) or for die stacking. These adhesives include products commonly known in the field such as screen-on die attach paste, die attachment film (DAF), film over wire (FOW) and non-conducting paste (NCP).

Figure 3:
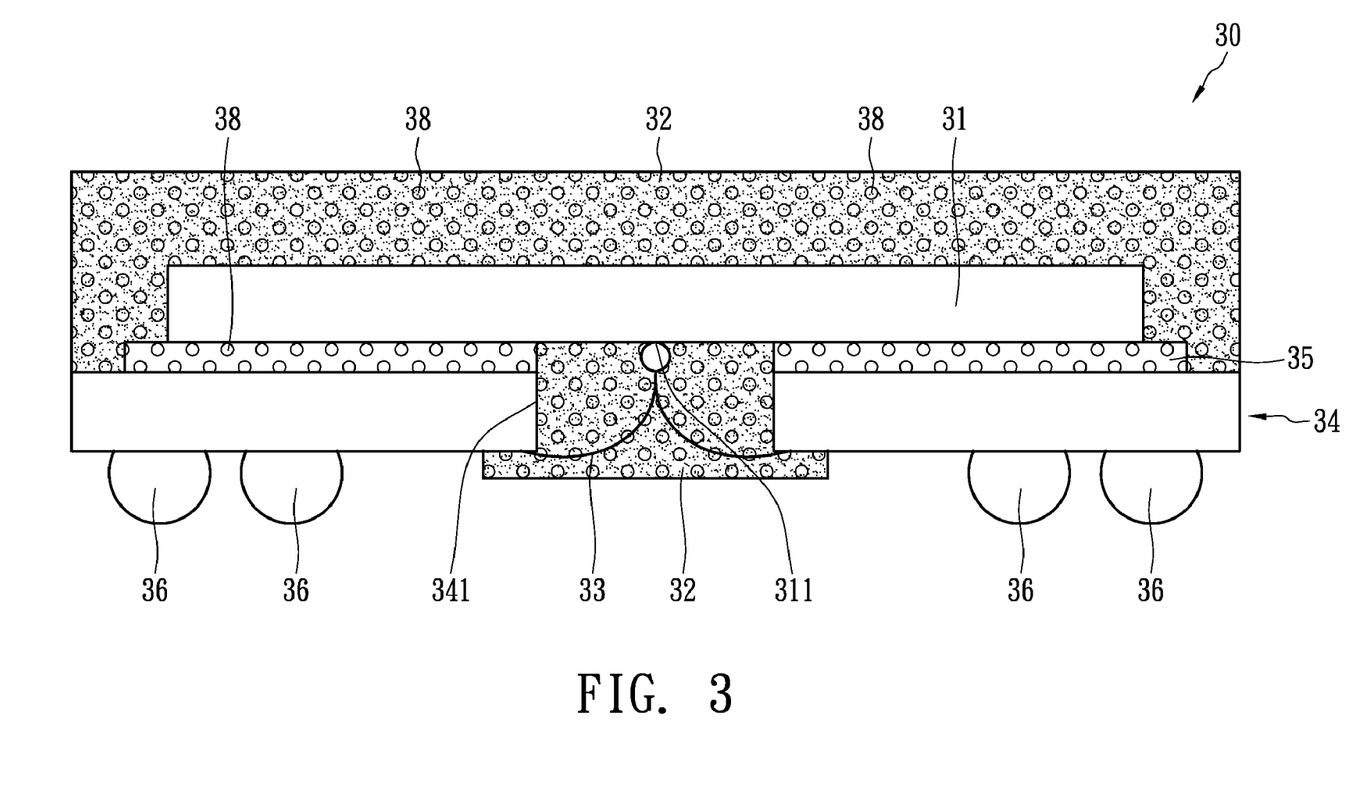
FIG. 3 is a cross-sectional diagram of an FBGA package in accordance with the present invention.

FIG. 3 is a cross-sectional diagram of an FBGA package in accordance with the present invention. The FBGA package 30 comprises a chip 31 and a substrate 34. The substrate 34 can be a rigid or flexible printed circuit board, and has an opening 341. The chip 31 is mounted on the substrate 34 by a die attaching material 35 such as an adhesive film or an adhesive paste, with its active surface 311 facing the substrate 34. A plurality of metal wires 33 electrically connect the chip 31 and the substrate 34 through the opening 341. Encapsulants 32 encapsulate the chip 31, the substrate 34 and the metal wires 33 to protect the chip 31 and the metal wires 33 from damage. Solder balls 36 are disposed on the lower surface of the substrate 34, and act as the I/O terminals of the FBGA package 30. The encapsulants 32 and the die attaching material 35 are mixed with carbon nanocapsules 38. Accordingly, the heat generated by the chip 31 can be dissipated to the outside of the package 30 via infrared radiation, rather than conventional heat conduction and convection. That is, the carbon nanocapsules 38 help to remove the heat accumulated in the package 30. Although the carbon nanocapsules 38 in the present embodiment are mixed in both the encapsulants 32 and the die attaching material 35, the carbon nanocapsules 38 in other embodiments can be mixed solely in the encapsulants 32 or solely in the die attaching material 35.

Figure 4:
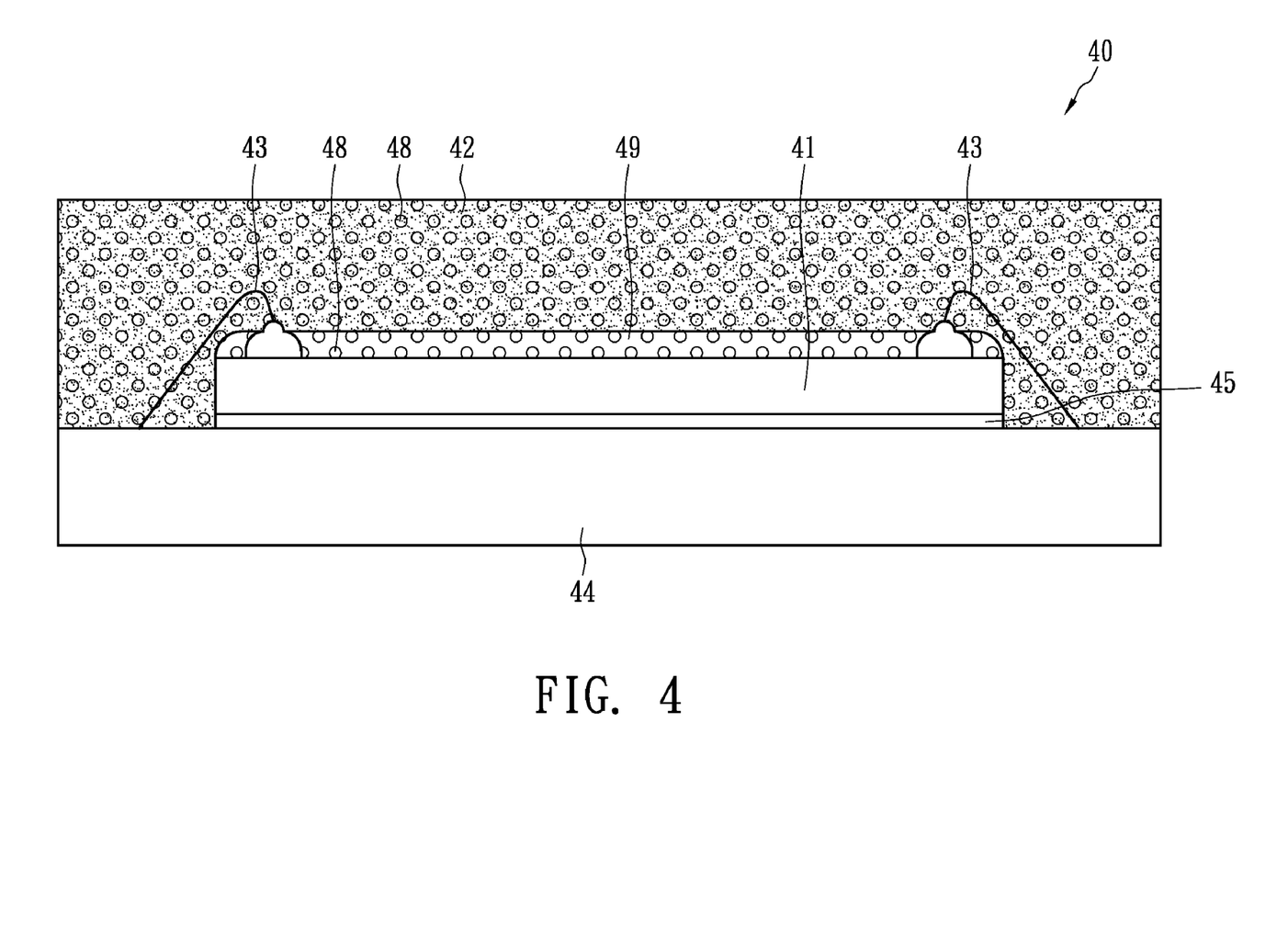
FIG. 4 is a cross-sectional diagram of a substrate-based package in accordance with the present invention.

As shown in FIG. 4, a substrate-based package 40 comprises a chip 41 and a substrate 44. The chip 41 is mounted on the substrate 44 by a die attaching material 45 such as an adhesive film or an adhesive paste. A coating layer 49 is overlaid on the active surface of the chip 41. Encapsulants 42 cover the chip 41, the substrate 44 and the metal wires 43 to protect the chip 41 and the metal wires 43 from damage. The encapsulant 42 and the coating layer 49 are mixed with carbon nanocapsules 48. The carbon nanocapsules 48 are evenly mixed in the encapsulant 42, die attaching material 45 and/or the die coating 49, so the heat generated from the chip 41 can be effectively dissipated by the carbon nanocapsules 48 via IR radiation.

Figure 5:
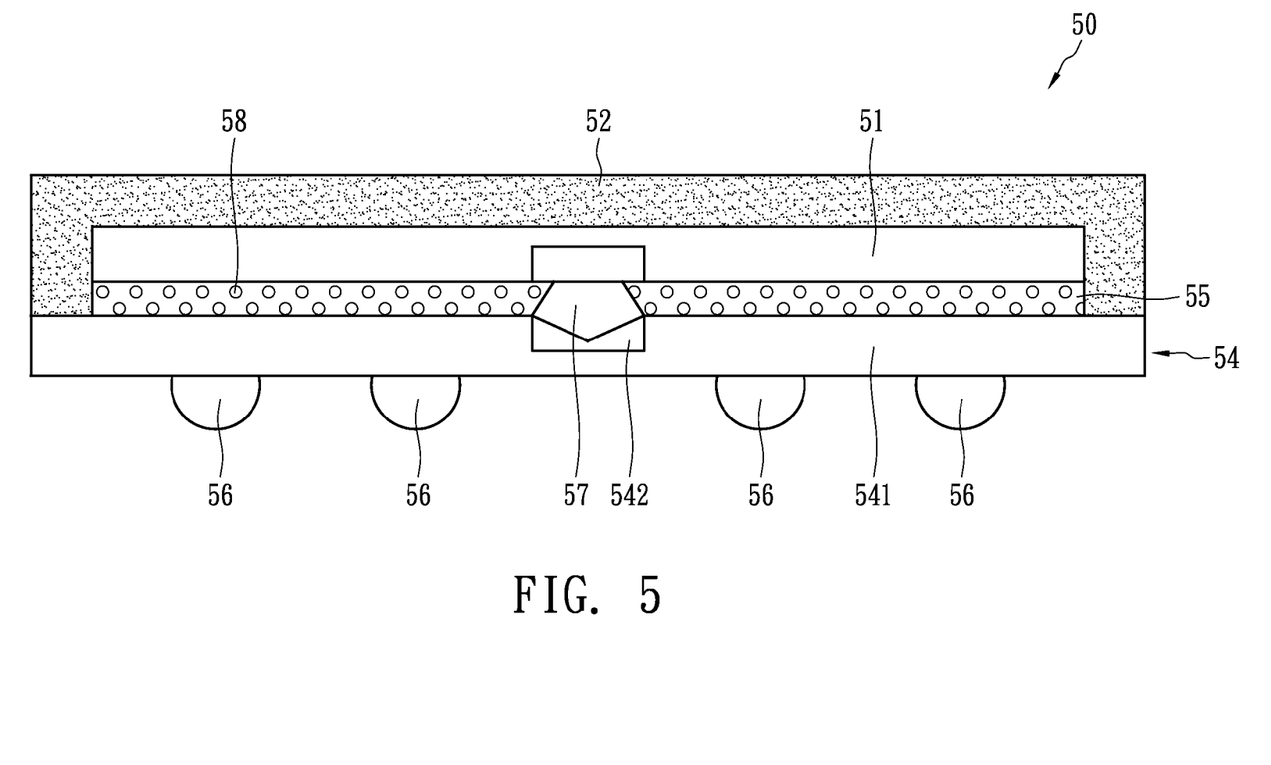
FIG. 5 is a cross-sectional diagram of a flip-chip BGA package in accordance with the present invention.

FIG. 5 shows a cross-sectional diagram of a flip-chip BGA package in accordance with the present invention. The flip-chip BGA package 50 comprises a chip 51, a non-conductive paste (NCP) (or underfill) 55, and a substrate 54. Moreover, the substrate 54 includes an insulation layer 541 and a wiring layer (or copper foil) 542 formed on the insulation layer 541. The chip 51 is mounted on the substrate 54 by flip-chip bonding. A plurality of bumps 57 formed on the chip 51 are connected to the wiring layer 542 of the substrate 54. The NCP 55 may completely fill the gap between the chip 51 and the substrate 54, and fixes the chip 51 on the substrate 54. Encapsulants 52 cover the chip 51, the substrate 54 and the bumps 57. The encapsulants 52 can protect the chip 51 from damage. Solder balls 56 are disposed on the lower surface of the substrate 54, and act as the I/O terminals of the flip-chip BGA package 50. The carbon nanocapsules 58 are evenly mixed in the NCP 55 and/or the encapsulants 52, so the heat generated from the chip 51 can be effectively dissipated by the carbon nanocapsules 58 via IR radiation through the substrate 54 to the environment.

Figure 6:
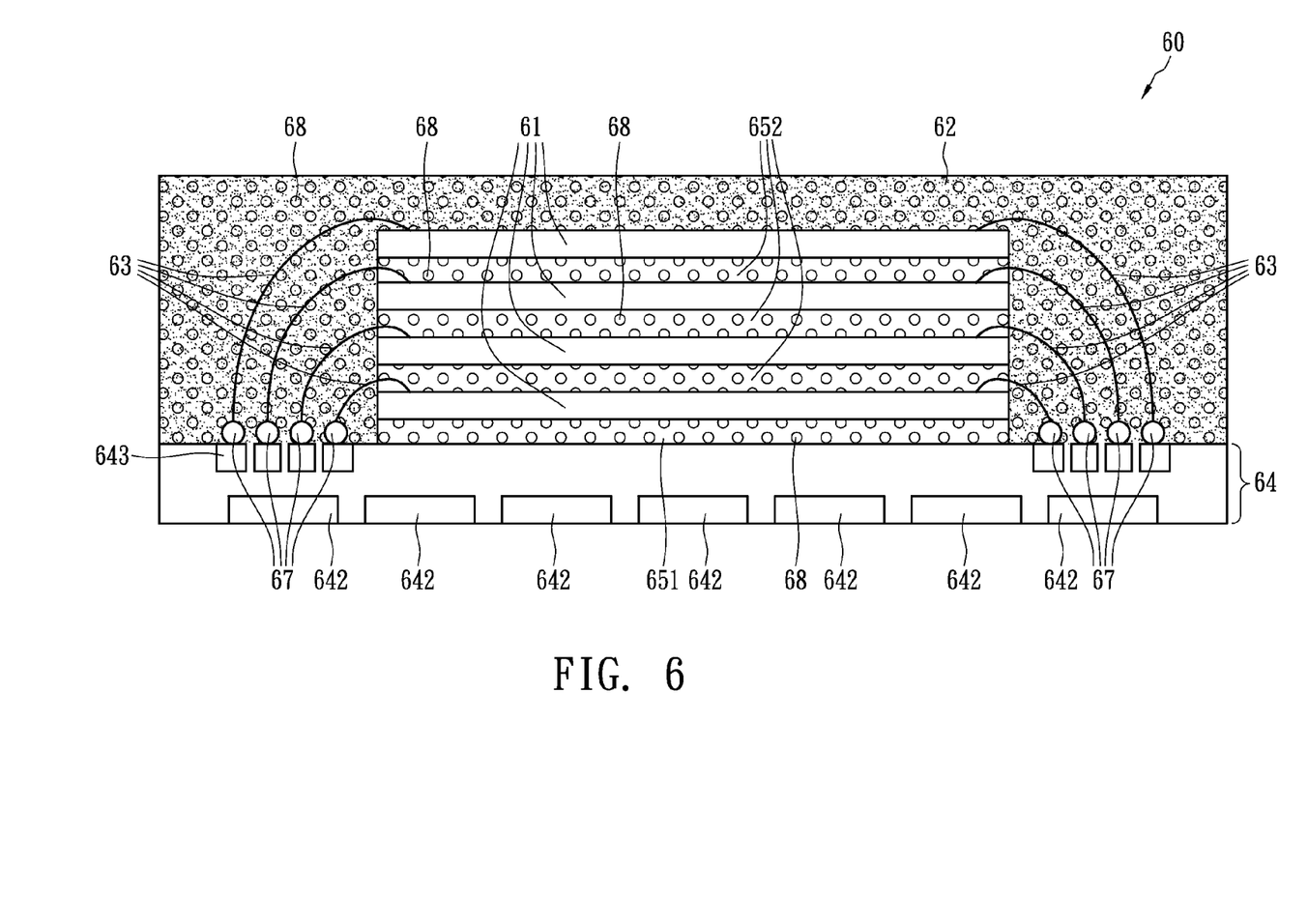
FIG. 6 is a cross-sectional diagram of a multi-chip package using FOWs (film over wire) in accordance with the present invention.

FIG. 6 is a cross-sectional diagram of a multi-chip package using FOWs (film over wire) in accordance with the present invention. The multi-chip package 60 comprises a plurality of IC chips 61, a plurality of FOW films 652, and a substrate 64. An adhesive 651 attaches the lowest chip 61 to the substrate 64. An encapsulant 62 covers the chips 61 and the substrate 64. Terminals or electrodes 642 are disposed on the lower surface of the substrate 64, and a wiring layer 643 is disposed on the upper surface of the substrate 64. Stud bumps 67 are formed on the wiring layer 643. Metal wires 63 are connected to the stud bumps 67 on the substrate 64 from the active surface of the chip 61.

FOW films 652 are employed to encapsulate the metal wires 63 bonded on the chips 61 where the FOW films 652 can provide additional support for the metal wires 63 and protect the metal wires 63 from breakage or electric short. Furthermore, the FOW films 652 can facilitate adhesion between two vertically stacked chips 61 of the same or similar dimensions adjacent to each other. When two chips are of the same or similar dimensions and are vertically stacked (e.g., one chip on top of the other), an issue related to wire bonding arises because the bonding pads on the lower chip may not extend beyond the area covered by the upper chip. Therefore, when an FOW film 652 is employed to encapsulate the metal wires 63 of the lower chip 61, a desired support for wire bonding can be provided to the upper chip 61. The FOW film 652 can reduce or minimize wire bonding issues for both the upper chip 61 and lower chip 61.

The encapsulant 62, the adhesive 651 and the FOW films 652 evenly mixed with the carbon nanocapsules 68 cover the chips 61 so the heat generated by the chips 61 can be easily dissipated to the external environment.

Figure 7:
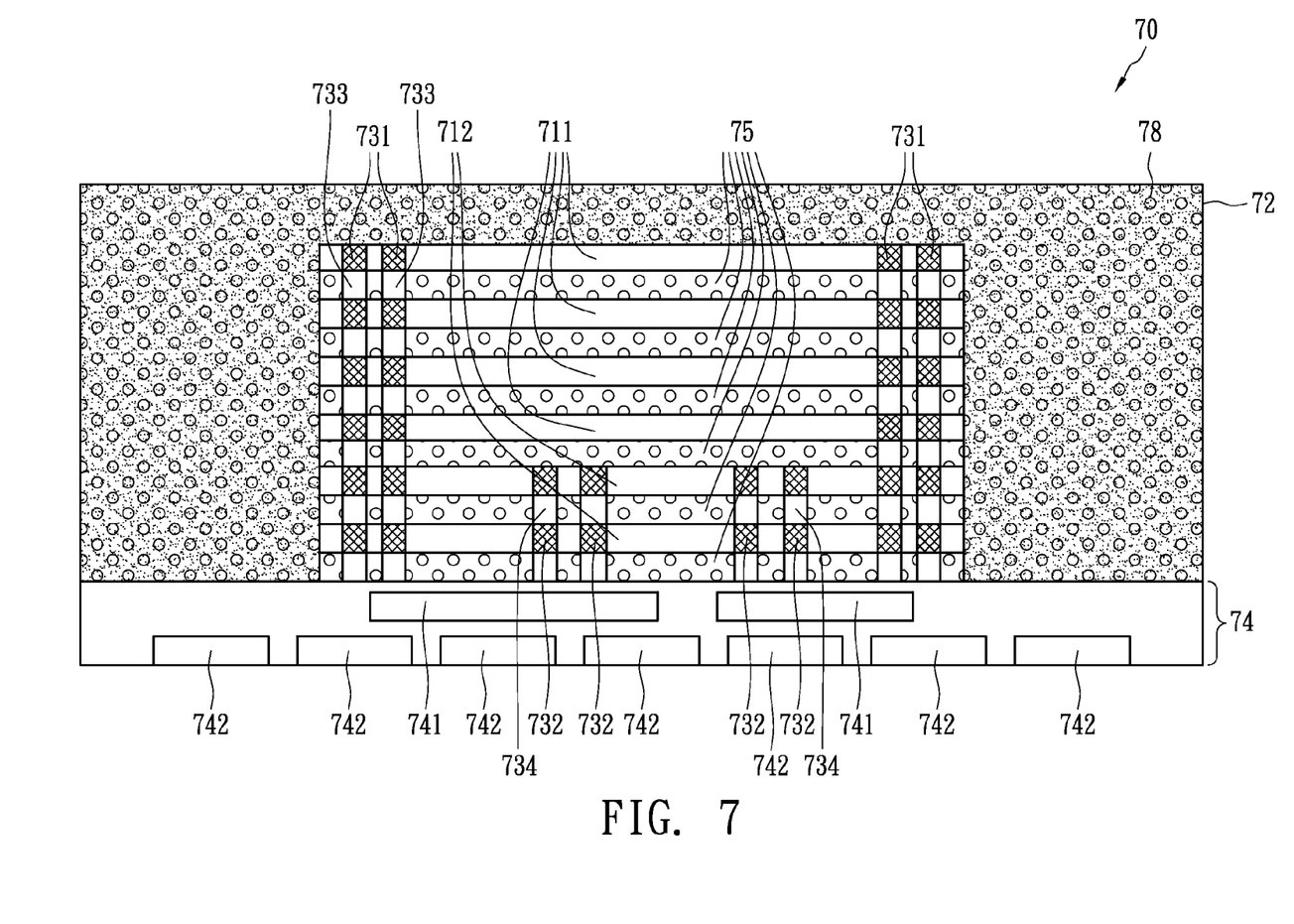
FIG. 7 is a cross-sectional diagram of a 3D IC package using TSVs in accordance with the present invention.

FIG. 7 is a cross-sectional diagram of a 3D IC package using TSVs in accordance with the present invention. The 3D IC package 70 comprises a plurality of IC chips (711, 712), TSVs (731, 732), and a substrate 74. TSVs 731, 732 are formed through the IC chips (711, 712) with a plurality of micro bumps or soft metal caps 733, 734 formed respectively on the TSVs 731, 732 for connecting purposes. The stacked IC chips (711, 712) and the substrate 74 are connected through the micro bumps or soft metal caps 733, 734 as shown in FIG. 7. Adhesives 75 are used to attach the chips (711, 712) together and mount them onto the substrate 74. An encapsulant 72 covers the chips (711, 712) and the substrate 74. Several passive IC chips 741 are embedded into the substrate 74, and terminals or electrodes 742 are disposed on the lower surface of the substrate 74. The encapsulant 72 and the adhesive 75 evenly mixed with the carbon nanocapsules 78 cover the chips (711, 712), so the heat generated from the chips (711, 712) can be easily dissipated to the external environment.

Figure 8:
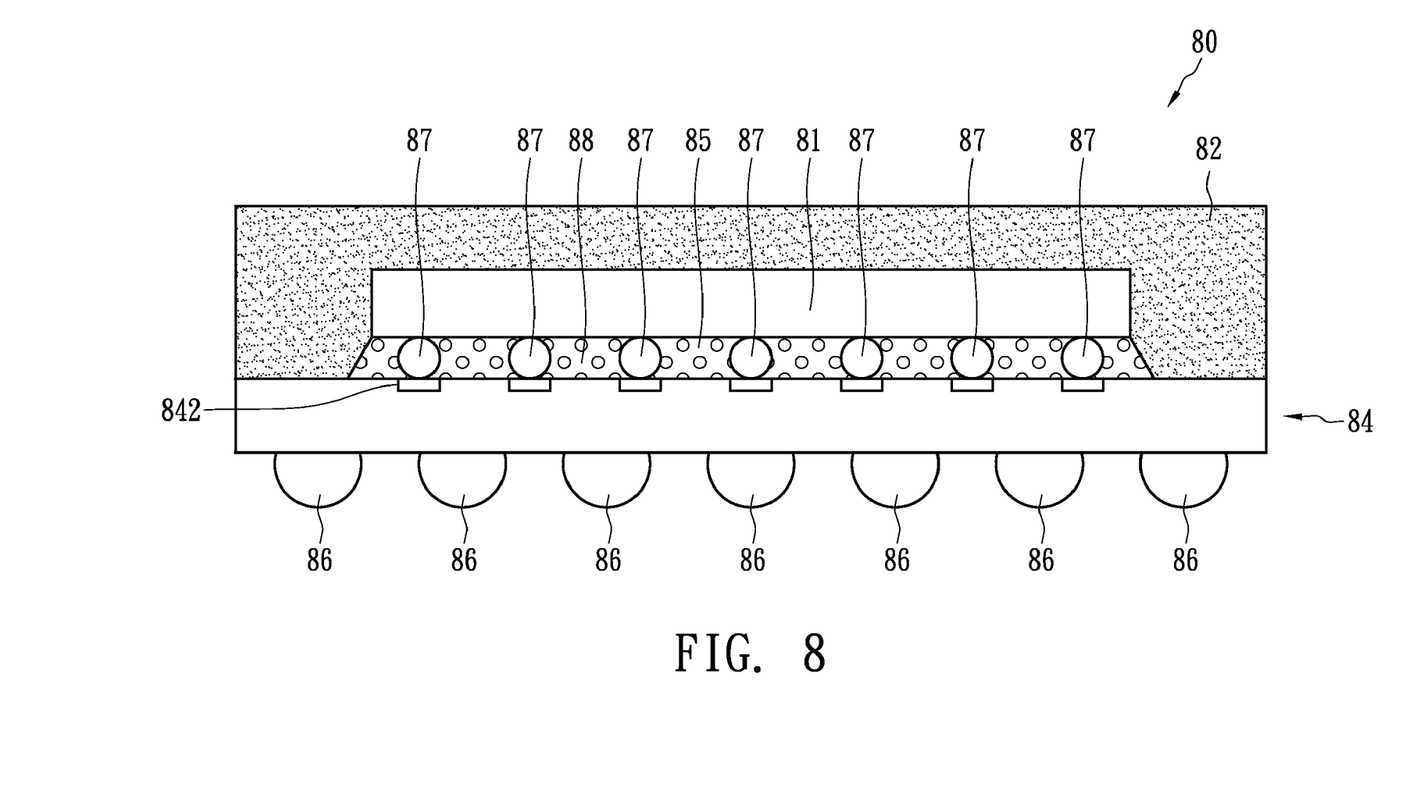
FIG. 8 is a cross-sectional diagram of a flip-chip BGA package in accordance with the present invention.

FIG. 8 shows a cross-sectional diagram of a flip-chip BGA package in accordance with the present invention. The flip-chip BGA package 80 comprises a chip 81, an underfill layer 85, and a substrate 84. The chip 81 is mounted on the substrate 84 by flip-chip bonding. A plurality of bumps 87 formed on the chip 81 are connected to the wiring layer 842 of the substrate 84. The underfill layer 85 may completely fill the gap between the chip 81 and the substrate 84. An encapsulant 82 covers the chip 81, the underfill layer 85 and the substrate 84. The carbon nanocapsules 88 are evenly mixed in the underfill layer 85 and/or the encapsulant 82, so the heat generated from the chip 81 can be effectively dissipated by the carbon nanocapsules 88 via IR radiation through the substrate 84 to the outside.

Figure 9:
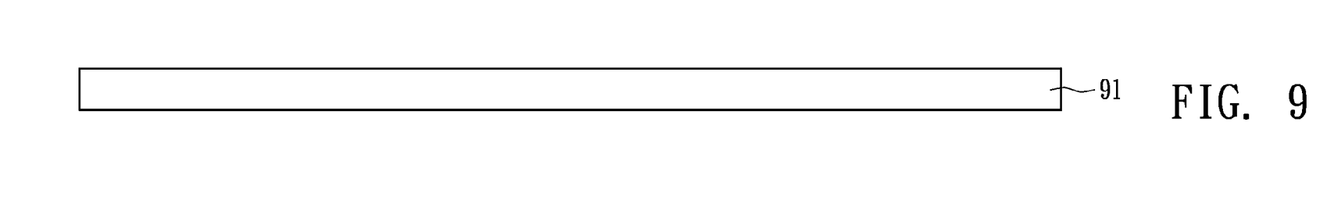
FIGS. 9 through 12 are sectional views demonstrating the steps of a method for applying an adhesive mixed with carbon nanocapsules in a WLCSP (Wafer-Level Chip Scale Package) process according to one embodiment of the present invention.
Figure 10:
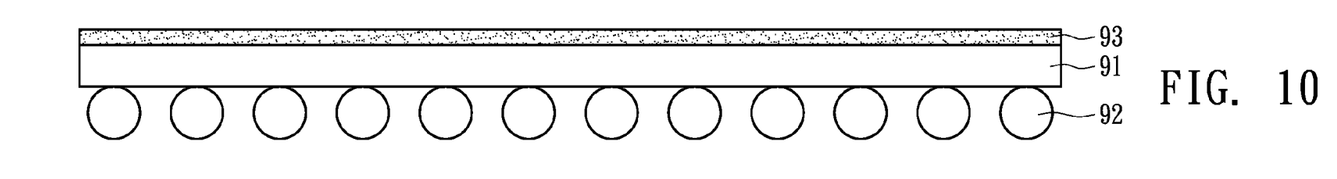
Figure 11:
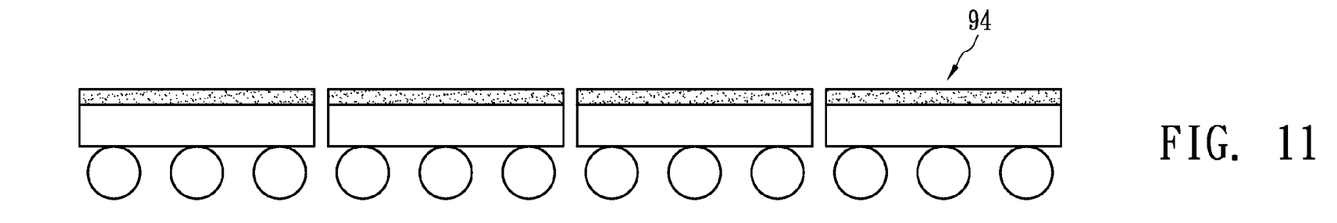
Figure 12:
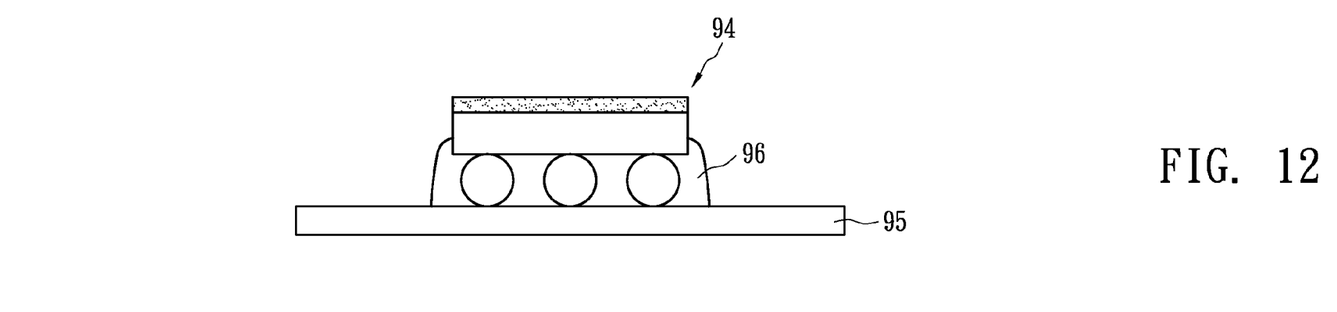

FIGS. 9 through 11 are cross-sectional views demonstrating the steps of a method for applying an adhesive mixed with carbon nanocapsules in a WLCSP (Wafer-Level Chip Scale Package) process according to one embodiment of the present invention. In FIG. 9, a wafer 91 including a plurality of integrated circuit chips is provided. In FIG. 10, a resin material 93 mixed with carbon nanocapsules is coated on the surface of the wafer 91 opposite a plurality of solder balls 92. In particular, the plurality of solder balls 92 can be provided either before or after the resin material 93 is coated. It should be noted that the resin material 93 can be coated on the back surface of the wafer 91. In FIG. 11, the coated wafer 91 is thereafter singulated into individual WLCSP electronic packages 94, each of which can be flip-chip bonded to a substrate 95, as shown in FIG. 12, with or without an underfill layer 96 filled between the electronic package 94 and the substrate 95 such as a printed circuit board or the like. In one embodiment, the underfill layer 96 can be mixed with a plurality of carbon nanocapsules.

Figure 13:
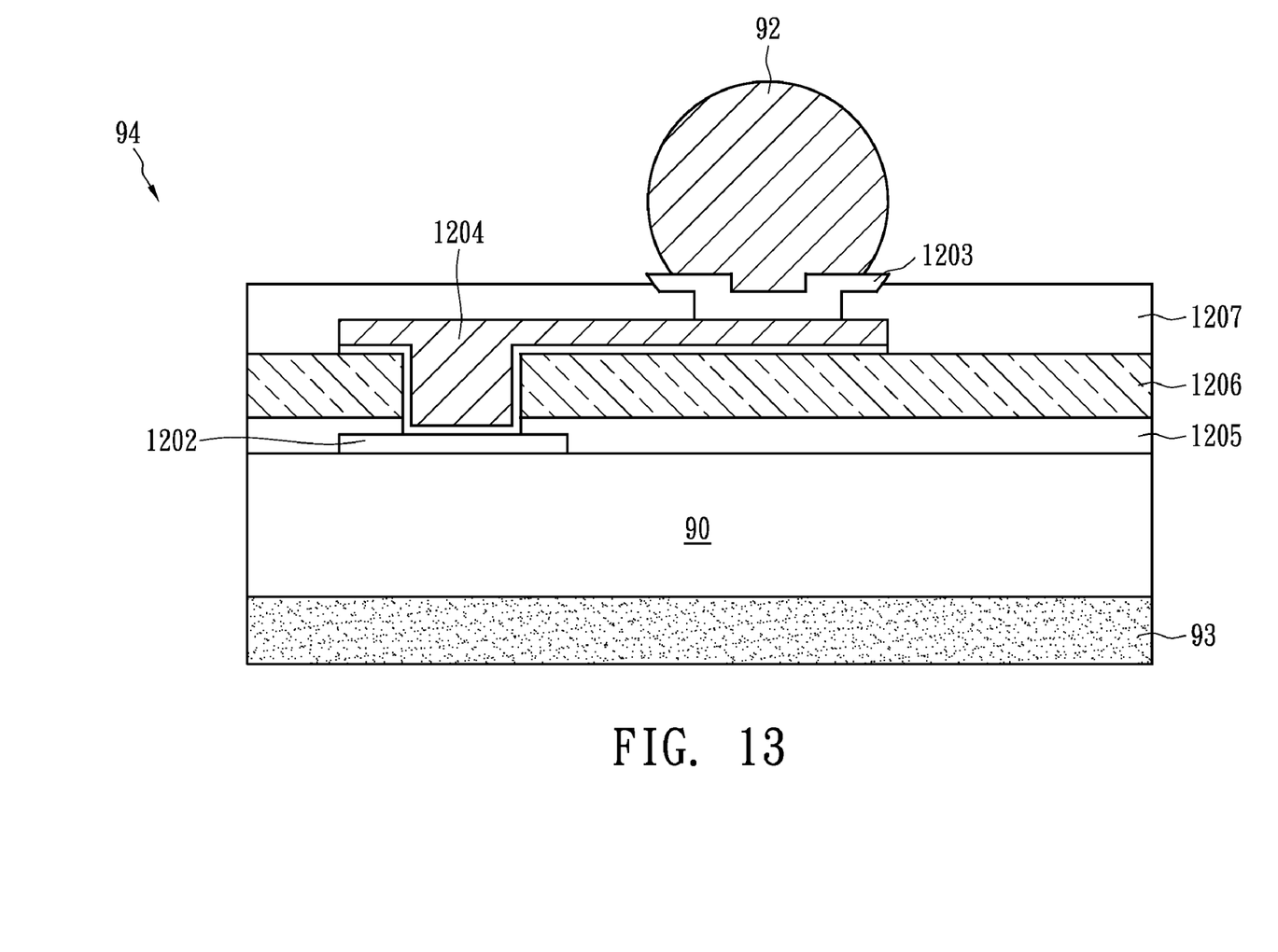
FIG. 13 is a view showing a thermally enhanced WLCSP electronic package according to one embodiment of the present invention.

As shown in FIG. 13, the thermally enhanced WLCSP electronic package 94 can be produced using wafer level packaging technology, which can be the redistribution layer and bump technology, the encapsulated copper post technology, the encapsulated wire bond technology, or the like. The resulting electronic package 94 has a dimension similar to that of the chip 90. In one embodiment, the electronic package 94 may comprise a chip 90 including a plurality of bond pads 1202, a plurality of redistributed bond pads 1203, a rewiring metal layer 1204 for redistributing the plurality of bond pads 1202 to the plurality of redistributed bond pads 1203, dielectric layers 1205, 1206, 1207 partially separating the rewiring metal layer 1204 from the chip 90 and from the plurality of redistributed bond pads 1203, resin material 93 covering the chip 90, and a plurality of carbon nanocapsules mixed in the resin material 93. In particular, the resin material 93 is on the back surface of the chip 90. The redistributed bond pads 1203 can be under-bump metal pads as shown in FIG. 13 or copper pillars (not shown). The dielectric layer 1205, 1206, 1207 may comprise polymer dielectric such as benzocyclobutane (BCB)-based polymer dielectric. In one embodiment, the carbon nanocapsules can be mixed in any or all of the dielectric layers 1205, 1206, and 1207. The rewiring metal layer 1204 may comprise copper or aluminum. Solder balls 92 can be attached to the redistributed bond pads 1203.

The above descriptions of the present invention are intended to be illustrative only. Numerous alternative methods may be devised by persons skilled in the art without departing from the scope of the following claims.

What is claimed is:

1. A thermally enhanced electronic package, comprising:
a substrate, including:
an insulation layer; and
a wiring layer formed on the insulation layer;
a chip electrically connected to the wiring layer;
an adhesive disposed between the chip and the substrate;
an encapsulation covering the chip and the substrate; and
a plurality of carbon nanocapsules mixed in the adhesive and the encapsulation.

2. The thermally enhanced electronic package of claim 1, further comprising a coating layer overlaid on an active surface of the chip, wherein the carbon nanocapsules are evenly distributed in the coating layer.

3. The thermally enhanced electronic package of claim 1, further comprising a plurality of metal wires electrically connecting the chip and the wiring layer.

4. The thermally enhanced electronic package of claim 1, further comprising a plurality of bumps electrically connecting the chip and the wiring layer.

5. The thermally enhanced electronic package of claim 1, wherein the chip has an active surface facing the substrate.

6. The thermally enhanced electronic package of claim 1, wherein the substrate has an opening.

7. The thermally enhanced electronic package of claim 6, further comprising a plurality of metal wires electrically connecting the chip and the wiring layer through the opening.

8. The thermally enhanced electronic package of claim 1, wherein the adhesive is a die attaching material, a non-conductive paste, or an underfill layer.

9. The thermally enhanced electronic package of claim 1, further comprising a plurality of solder balls disposed on the substrate.

10. A thermally enhanced electronic package, comprising:
a substrate, including:
an insulation layer; and
a wiring layer formed on the insulation layer;
a plurality of chips vertically stacked and electrically connected to the wiring layer;
a first adhesive attaching one of the chips to the substrate;
second adhesives combining the chips together;
an encapsulation covering the chip and the substrate; and
a plurality of carbon nanocapsules mixed in the first adhesive, the second adhesives and the encapsulation.

11. The thermally enhanced electronic package of claim 10, further comprising a plurality of metal wires electrically connecting the chips and the wiring layer.

12. The thermally enhanced electronic package of claim 11, wherein the second adhesives are FOW (film over wire) films.

13. The thermally enhanced electronic package of claim 10, further comprising a plurality of TSVs (through silicon vias) electrically connecting the chips and the wiring layer.

14. The thermally enhanced electronic package of claim 13, wherein the TSVs are through holes filled with metal formed on the chips.

15. The thermally enhanced electronic package of claim 13, further comprising several passive IC chips embedded in the substrate.

16. The thermally enhanced electronic package of claim 10, wherein the chips are sequentially stacked on top of each other.

17. A method of manufacturing a thermally enhanced electronic package, comprising the steps of:
providing a wafer including a plurality of integrated circuit chips on one surface;
coating a surface opposite to the surface with the integrated circuit chips of the wafer with a resin material mixed with a plurality of carbon nanocapsules;
dicing the coated wafer to obtain a plurality of electronic packages;
flip-chip bonding the electronic package to a substrate; and
forming an underfill layer between the electronic package and the substrate;
wherein the underfill layer is mixed with a plurality of carbon nanocapsules.

18. The method of claim 17, further comprising a step of attaching a plurality of solder balls on a surface of the wafer opposite to the surface with the resin material coated on.

19. A thermally enhanced wafer level chip scale package, comprising:
a substrate;
a wafer including a plurality of integrated circuit chips and a plurality of solder balls on one surface;
a resin material mixed with a plurality of carbon nanocapsules positioned on the surface of the wafer opposite to the plurality of solder balls; and
a underfill layer disposed between the surface with the plurality of solder balls and the substrate;
wherein the underfill layer is mixed with a plurality of carbon nanocapsules.

* * * * *